(12) United States Patent
Pal et al.

(10) Patent No.: US 11,428,168 B2
(45) Date of Patent: Aug. 30, 2022

(54) STARTER/GENERATOR ARRANGEMENTS FOR GAS TURBINE ENGINES

(71) Applicant: Hamilton Sundstrand Corporation, Charlotte, NC (US)

(72) Inventors: Debabrata Pal, Hoffman Estates, IL (US); Craig R. LeGros, Rockford, IL (US); Tom A. Utecht, Cherry Valley, IL (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 117 days.

(21) Appl. No.: 16/735,212

(22) Filed: Jan. 6, 2020

(65) Prior Publication Data

US 2021/0207542 A1    Jul. 8, 2021

(51) Int. Cl.
| | |
|---|---|
| *F02C 7/268* | (2006.01) |
| *F01D 15/10* | (2006.01) |
| *F02C 7/12* | (2006.01) |
| *H05K 7/20* | (2006.01) |

(52) U.S. Cl.
CPC .............. *F02C 7/268* (2013.01); *F01D 15/10* (2013.01); *F02C 7/12* (2013.01); *H05K 7/20318* (2013.01); *H05K 7/20327* (2013.01); *H05K 7/20936* (2013.01)

(58) Field of Classification Search
CPC ...................................... F02C 7/32; F02C 7/36
See application file for complete search history.

(56) References Cited

U.S. PATENT DOCUMENTS

| | | | |
|---|---|---|---|
| 4,944,344 A | 7/1990 | Crowe | |
| 7,289,325 B2 | 10/2007 | Brasz et al. | |
| 8,033,796 B2 * | 10/2011 | Kameya ................. | F04C 2/102 |
| | | | 417/44.11 |
| 8,042,343 B2 | 10/2011 | Jarlestal | |
| 8,760,855 B2 | 6/2014 | Howes et al. | |
| 9,332,671 B2 | 5/2016 | Schult et al. | |
| 9,473,040 B2 | 10/2016 | White | |
| 9,657,969 B2 | 5/2017 | Vaisman et al. | |
| 10,018,456 B2 | 7/2018 | Lyons et al. | |

(Continued)

FOREIGN PATENT DOCUMENTS

| | | |
|---|---|---|
| EP | 3190282 A1 | 7/2017 |
| EP | 3236725 A1 | 10/2017 |
| WO | 2015044614 A1 | 4/2015 |

OTHER PUBLICATIONS

European Search Report Issued in European Applicatioin No. 21150275.2-1007 dated Jun. 4, 2021; 8 Pages.

*Primary Examiner* — Ehud Gartenberg
*Assistant Examiner* — Thuyhang N Nguyen
(74) *Attorney, Agent, or Firm* — Cantor Colburn LLP

(57) ABSTRACT

A starter/generator arrangement includes a starter/generator, a power converter electrically connected to the starter/generator, and coolant circuit with a pump and a condenser in fluid communication with the power converter. The power converter is arranged to flow start mode electrical power in a first direction in a start mode and a second direction in a generate mode. The coolant circuit fluidly couples the pump to the condenser for storing heat in a coolant disposed within the coolant circuit while flowing the start mode electrical power in the first direction. Gas turbine engines and methods of cooling starter/generator arrangements are also described.

10 Claims, 5 Drawing Sheets

(56) References Cited

U.S. PATENT DOCUMENTS

| | | | |
|---|---|---|---|
| 10,049,963 B2 | 8/2018 | Menon et al. | |
| 10,111,366 B2 * | 10/2018 | Fan | H05K 7/20336 |
| 10,201,119 B2 | 2/2019 | Pal | |
| 10,451,353 B2 | 10/2019 | Pal | |
| 10,687,652 B1 * | 6/2020 | Kwiatkowski | A47J 31/52 |
| 2013/0098058 A1 * | 4/2013 | Sheridan | F02C 7/32 |
| | | | 60/783 |
| 2013/0286591 A1 | 10/2013 | Myers et al. | |
| 2015/0173254 A1 * | 6/2015 | Rodriguez | H02J 4/00 |
| | | | 361/699 |
| 2017/0002744 A1 * | 1/2017 | Poumarede | H02K 23/00 |
| 2017/0082029 A1 * | 3/2017 | Zipperer | F02C 7/32 |
| 2018/0202695 A1 * | 7/2018 | Pfutze | F25B 25/005 |
| 2018/0305036 A1 * | 10/2018 | Vondrell | H02K 7/1823 |
| 2019/0218972 A1 * | 7/2019 | Schofield | F02K 3/06 |
| 2019/0257211 A1 * | 8/2019 | Huang | F01D 15/10 |
| 2021/0153392 A1 * | 5/2021 | Gao | H05K 7/2079 |

\* cited by examiner

STARTER/GENERATOR ARRANGEMENTS FOR GAS TURBINE ENGINES

BACKGROUND

The present disclosure is generally related to starter/generator arrangements for gas turbine engines, and more particularly to cooling power converters in starter/generator arrangements.

Vehicles, such as aircraft, commonly employ starter/generators for both starting the aircraft engine and generating electrical power aircraft electrical systems subsequent to starting. A power converter commonly cooperates with the starter/generator to convert power flowing through the starter/generator. For example, during engine starting the power converter generally converts external power into a form suitable for rotating the gas turbine engine rotor using the starter/generator. Once the gas turbine engine has started the power converter typically converts electrical power provided by the starter/generator into a form suitable for the aircraft electrical system.

Power flow through power converters generally results in heat generation. In some starter/generators the magnitude of the heat generated by the power converter requires providing a coolant flow to the power converter. In such starter/generators coolant is generally driven to the power converter using mechanical power provided by the engine, such as by an engine-drive fan or an engine-driven pump. During engine starting, however, the engine may be unable to provide power for cooling the power converter. For example, there may be a delay between the beginning of the engine start and the time at which electrical and/or mechanical power is available to provide a coolant flow to the power converter.

Such systems and methods have generally been acceptable for their intended purpose. However, there remains a need in the art for improved starter/generator arrangements, gas turbine engines, and methods of cooling power converters during gas turbine engine starting.

BRIEF DESCRIPTION

A starter/generator arrangement is provided. The starter/generator arrangement includes a starter/generator having a start mode and a generate mode, a power converter, and a coolant circuit. The power converter is electrically connected to the starter/generator to flow start mode electrical power in a first direction from a power source to the starter/generator in the start mode and generate mode electrical power in a second direction from the starter/generator to an electrical load in the generate mode. The coolant circuit has a pump and a condenser in fluid communication with the power converter. The pump is fluidly coupled to the condenser through the power converter to cool the power converter by storing heat in a coolant disposed within the coolant circuit while flowing the start mode electrical power in the first direction through the power converter.

In addition to one or more of the features described above, or as an alternative, further embodiments of the starter/generator arrangement may include an active rectifier.

In addition to one or more of the features described above, or as an alternative, further embodiments of the starter/generator arrangement may include that the power converter has a plurality of solid-state switch devices operatively associated with a controller via a pulse width modulation signal to convert power flowing through the power converter.

In addition to one or more of the features described above, or as an alternative, further embodiments of the starter/generator arrangement may include that the coolant includes ethoxy-nonafluorobutane.

In addition to one or more of the features described above, or as an alternative, further embodiments of the starter/generator arrangement may include the power converter has a housing with an interior, a cold plate arranged within the interior of the housing and bounding the coolant circuit extending through the housing, and a two or more of solid-state switch devices arranged within the interior of the housing, the two or more solid-state switch devices connected to the cold plate and arranged on a side of the cold plate opposite the coolant circuit.

In addition to one or more of the features described above, or as an alternative, further embodiments of the starter/generator arrangement may include that the coolant circuit has a supply conduit fluidly coupling the condenser to the pump, an intermediate conduit fluidly coupling the pump to the power converter, and a return conduit fluidly coupling the power converter to the condenser, the condenser being arranged above the power converter relative to gravity.

In addition to one or more of the features described above, or as an alternative, further embodiments of the starter/generator arrangement may include that the intermediate conduit is fluidly coupled to the return conduit by the power converter, the power converter being arranged above the intermediate conduit relative to gravity.

In addition to one or more of the features described above, or as an alternative, further embodiments of the starter/generator arrangement may include that the return conduit is fluidly coupled the supply conduit by the power converter, the return conduit arranged above the power converter relative to gravity.

In addition to one or more of the features described above, or as an alternative, further embodiments of the starter/generator arrangement may include that the supply conduit is fluidly coupled to the intermediate conduit by the pump, wherein the pump is arranged below the power converter relative to gravity.

In addition to one or more of the features described above, or as an alternative, further embodiments of the starter/generator arrangement may include an accessory gearbox connected to the starter/generator and the pump.

In addition to one or more of the features described above, or as an alternative, further embodiments of the starter/generator arrangement may include a starter/generator lead electrically connecting the power converter to the starter/generator.

In addition to one or more of the features described above, or as an alternative, further embodiments of the starter/generator arrangement may include that the start mode electrical power flows from the power converter to the starter/generator through the starter/generator lead in the first direction.

In addition to one or more of the features described above, or as an alternative, further embodiments of the starter/generator arrangement may include that the generate mode electrical power flows from the starter/generator to the power converter through the starter/generator lead in the second direction.

In addition to one or more of the features described above, or as an alternative, further embodiments of the starter/generator arrangement may include that the starter/generator lead includes an A-phase lead, a B-phase lead, and a C-phase lead electrically connecting the power converter to the starter/generator.

In addition to one or more of the features described above, or as an alternative, further embodiments of the starter/generator arrangement may include that the controller has a processor operatively connected to the power converter; a memory disposed in communication with the processor and having instructions recorded thereon that cause the processor to: flow the start mode electrical power through the power converter in the first direction; cool the power converter by vaporizing the coolant disposed within the power converter while flowing the start mode electrical power through the power converter in the first direction; and start a gas turbine operably connected to the starter/generator with the start mode electrical power cooling the power converter by vaporizing the coolant.

In addition to one or more of the features described above, or as an alternative, further embodiments of the starter/generator arrangement may include that the instructions further cause the processor to flow the generate mode electrical power through the power converter in the second direction and cool the power converter by circulating the coolant through the power converter while flowing the generate mode electrical power through the power converter in the second direction.

In addition to one or more of the features described above, or as an alternative, further embodiments of the starter/generator arrangement may include that the instructions cause the power converter to cease flowing the start mode electrical power through the power converter upon start of a gas turbine engine operatively associated with the starter/generator.

A gas turbine engine is also provided. The gas turbine includes a fan supported for rotation about a rotation axis, a fan shroud, and a starter/generator arrangement as described above. The fan shroud extends about the fan and axially along the rotation axis, the fan shroud bounding a bounding a fan duct defined between the fan shroud and the rotation axis. The starter/generator arrangement is arranged within the fan duct.

A method of cooling a power converter includes, at a starter/generator as described above, flowing start mode electrical power through the power converter in a first direction while in the start mode, communicating the start mode electrical power to the starter/generator from a power source, and cooling the power converter by storing heat in a coolant disposed within the coolant circuit while flowing the start mode electrical power through the power converter in the first direction.

In addition to one or more of the features described above, or as an alternative, further embodiments of the method may include flowing generate mode electrical power in a second direction through the power converter in the generate mode, communicating the generate mode electrical power from the starter/generator to an electrical load, and cooling the power converter by circulating the coolant through the coolant circuit while flowing the generate mode electrical power through the power converter in the second direction Technical effects of the present disclosure include the capability to provide cooling to power converters during starting. In certain examples the present disclosure provides the capability to cool power converters in starter/generator arrangements passively, using the heat storage capability of coolant resident within the starter/generator coolant circuit to cool the power converter during engine starting. Technical effects also include the coolant circuit sizing sufficient to both store heat generated by the power converter during starting and position the coolant circuit within the fan duct of a gas turbine engine.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
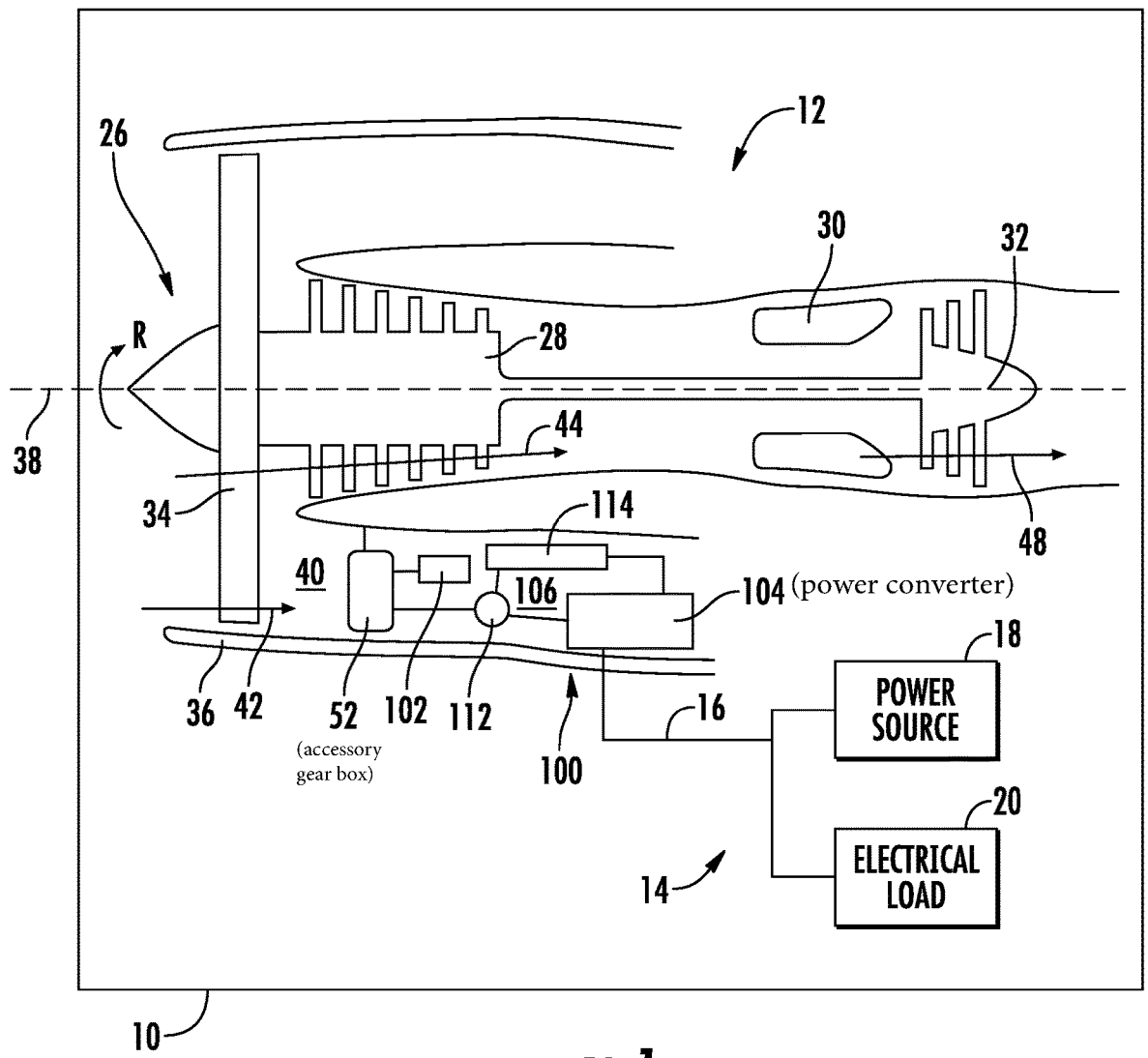
FIG. 1 is a schematic view of a vehicle carrying a gas turbine engine and a starter/generator arrangement constructed in accordance with the present disclosure, showing a coolant circuit and a starter generator arranged within a fan duct of the gas turbine engine.

Reference will now be made to the drawings wherein like reference numerals identify similar structural features or aspects of the subject disclosure. For purposes of explanation and illustration, and not limitation, a partial view of an example of a starter/generator arrangement constructed in accordance with the disclosure is shown in FIG. 1 and is designated generally by reference character 100. Other embodiments of starter/generator arrangements, gas turbine engines, and methods of providing cooling to power converters during gas turbine engine starting are provided in FIGS. 2-5, as will be described. The systems and methods described herein can be used for cooling power converters in starter/generator arrangements in gas turbine arrangements, such as during starting as well as during operation subsequent to starting, though the not limited to any particular mode of operation or to gas turbine engines in general.

Referring to FIG. 1, a vehicle 10, e.g., an aircraft, is shown. The vehicle 10 includes the starter/generator arrangement 100, a gas turbine engine 12, and an electrical system 14. The electrical system 14 includes a power bus 16, a power source 18, and an electrical load 20. The power bus 16 electrically connects the starter/generator arrangement 100 to the power source 18 and the electrical load 20. It is also contemplated that the power bus 16 communicate the generate mode electrical power 24 (shown in FIG. 3) to the electrical load 20 to operate the electrical load 20. It is also contemplated that the power bus 16 communicate the start mode electrical power 22 (shown in FIG. 4) to the starter/generator arrangement 100 to start the gas turbine engine 12. In certain examples the power bus 16 is a high-voltage direct current (DC) power bus, e.g., 270 volts or higher.

The gas turbine engine 12 includes a fan section 26, a compressor section 28, a combustor section 30, and a turbine section 32. The fan section 26 includes a fan 34 and a fan shroud 36. The fan 34 is supported for rotation R about a rotation axis 38 and is operatively associated with the turbine section 32. The fan shroud 36 extends about the fan 34 and defines a fan duct 40 radially between the fan shroud 36 and the compressor section 28. The fan duct 40 extends axially along the rotation axis 38 and contains therein starter/generator arrangement 100. Although a particular gas turbine engine arrangement is shown and described herein it is to be understood and appreciated that gas turbines having other arrangements can also benefit from the present disclosure.

The compressor section 28 is operatively associated with the turbine section 32 and is arranged to compress a working fluid flow 44 ingested from the external environment 46. The combustor section 30 fluidly couples the compressor section 28 to the turbine section 32 and is arranged to generate a high-pressure combustion product flow 48 using the working fluid flow 44 subsequent to compression. The turbine section 32 is operatively connected to the compressor section 28 and the fan 34, is in fluid communication with the combustor section 30, and is arranged communicate mechanical rotation 50 to both the compressor section 28 and the fan 34 using work extracted from the high-pressure combustion product flow 48 generated by the combustor section 30. During operation the rotation of the fan 34 about the rotation axis 38 drives an ambient air flow 42 through the fan duct 40 to provide cooling for the starter/generator arrangement 100 while electrical power flows through the starter/generator arrangement 100.

The starter/generator arrangement 100 generally includes a starter/generator 102, a power converter 104, and a coolant circuit 106. The starter/generator 102 has a start mode 108 (shown in FIG. 2) and a generate mode 110 (shown in FIG. 2). The power converter 104 is electrically connected to the starter/generator 102, is configured to flow start mode electrical power 22 (shown in FIG. 4) in a first direction B (shown in FIG. 4) while in the start mode 108, and further configured to flow generate mode electrical power 24 (shown in FIG. 3) in a second direction A (shown in FIG. 3) while in the generate mode 110. The coolant circuit 106 includes a pump 112 and a condenser 114 in fluid communication with the power converter 104, the pump 112 fluidly coupled to the condenser 114 by the power converter 104 to cool the power converter 104 by storing heat in a coolant 116 (shown in FIG. 2) disposed within the coolant circuit 106 while flowing the start mode electrical power 22 in the first direction A through the power converter 104.

In the illustrated example the gas turbine engine 12 includes an accessory gearbox 52. The accessory gearbox 52 mechanically connects the starter/generator 102 and the pump 112. Subsequent to starting, e.g., when the starter/generator 102 is in the generate mode 110, the accessory gearbox 52 communicates starter/generator rotation $R_1$ to the starter/generator 102 and pump rotation $R_2$ to the pump 112. The starter/generator 102 converts the starter/generator rotation $R_1$ into the generate mode electrical power 24 and communicates the generate mode electrical power 24 to the power converter 104, which the power converter 104 communicates in the second direction B (shown in FIG. 3) to the power bus 16 for powering the electrical load 20. The pump 112 converts the pump rotation $R_2$ into hydraulic pressure, which circulates the coolant 116 (shown in FIG. 2) through coolant circuit 106 to cool the power converter 104. While the start mode 108, however, the pump rotation $R_2$ may be insufficient (or unable entirely) to circulate the coolant 116 through the coolant circuit 106 to cool the power converter 104. The coolant circuit 106 is therefore arranged to cool the power converter 104 by storing heat within the coolant 116 without requiring circulation of the coolant 116 through the coolant circuit 106.

Figure 2:
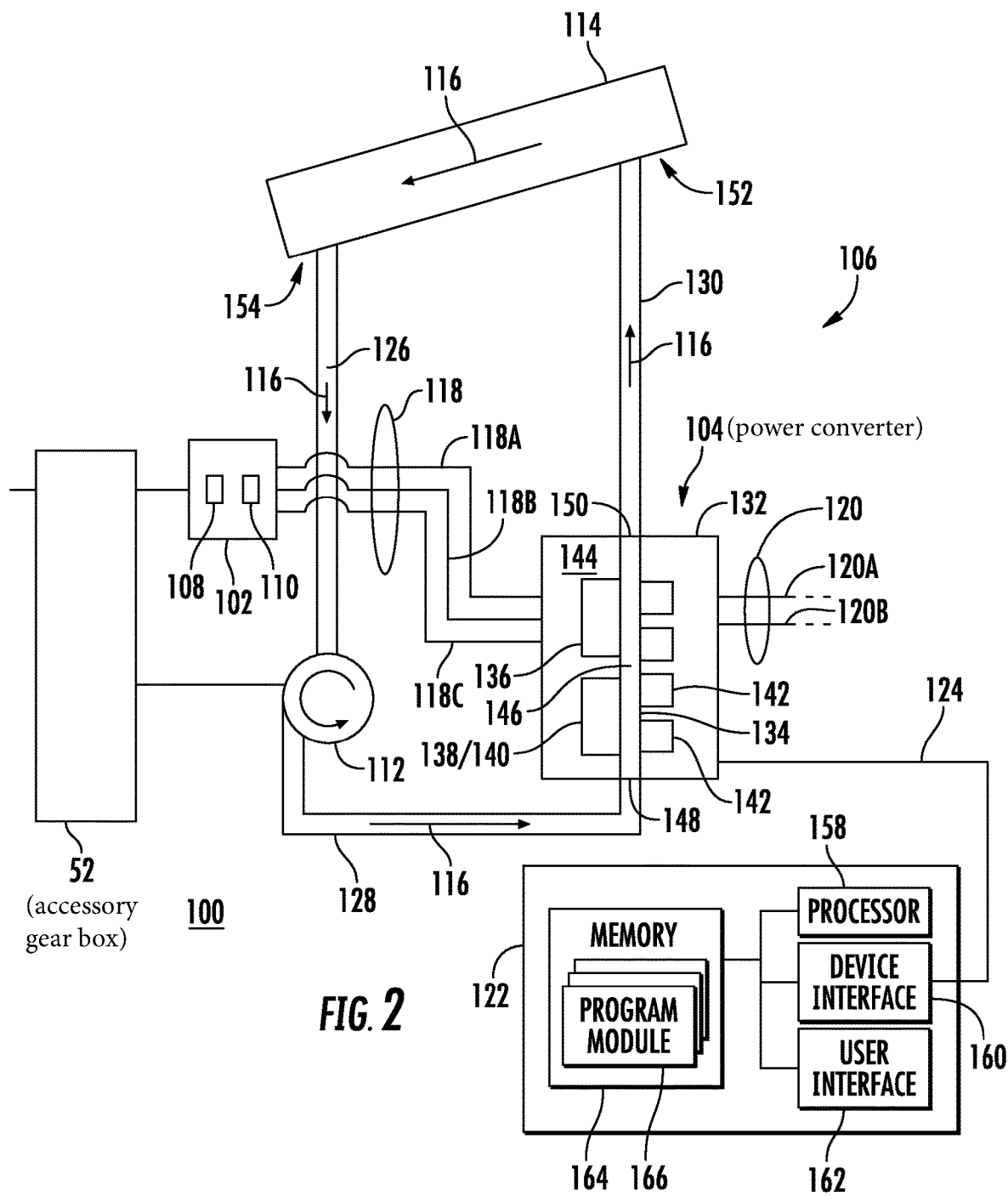
FIG. 2 is a schematic view of the starter/generator arrangement of FIG. 1, showing a power converter in fluid communication with a coolant circuit for cooling the power converter during start and generate modes.

With reference to FIG. 2, the starter/generator arrangement 100 is shown. As shown in FIG. 2 the starter/generator arrangement 100 also includes the coolant 116, a starter/generator lead 118, and a power bus lead 120. The starter/generator arrangement 100 further includes a controller 122 and a link 124.

The starter/generator 102 is operatively connected to gas turbine engine 12 (shown in FIG. 1) by the accessory gearbox 52. The starter/generator 102 is also electrically connected to the power converter 104 by the starter/generator lead 118. In certain examples the starter/generator 102 is an alternating current (AC) power electrical machine. In accordance with certain examples the starter/generator 102 can be a variable frequency starter/generator (VFSG). In the illustrated example the starter/generator lead is an AC lead having an A-phase lead 118A, a starter/generator B-phase lead 118B, and a starter/generator C-phase lead 118C. As also shown in FIG. 2, the power bus lead 120 is a high-voltage DC (HVDC) lead having an HVDC source lead 120A and an HVDC return lead 120B.

The coolant circuit 106 includes the power converter 104, the pump 112, the condenser 114, and the coolant 116. The coolant circuit 106 also includes a supply conduit 126, an intermediate conduit 128, and a return conduit 130.

The supply conduit 126 fluidly couples the condenser 114 to the pump 112. The pump 112 fluidly couples the supply conduit 126 to the intermediate conduit 128. The intermediate conduit 128 fluidly couples the pump 112 to the power converter 104. The power converter 104 fluidly couples the intermediate conduit 128 to the return conduit 130. The return conduit 130 fluidly couples the power converter 104 to the condenser 114. The condenser 114 in turn fluidly couples the return conduit 130 to the supply conduit 126. In certain examples the pump 112 is arranged below the power converter 104 relative to gravity, facilitating siphoning coolant therefrom when the pump 112 is idle.

The coolant 116 is disposed within the coolant circuit 106 and for circulation therethrough by operation of the pump 112. More specifically, the coolant 116 is disposed within the coolant circuit 106 in a closed-loop arrangement for cooling the power converter 104. In certain examples the coolant 116 includes ethoxy-nonafluorobutane. Ethoxy-nonafluorobutane has the advantage that its thermodynamic properties, e.g., boiling point and heat of vaporization, allow a relatively small mass disposed within coolant circuit 106 to cool the power converter 104 via circulation, when pumped through the coolant circuit 106 during the start mode 108, and to cool the power converter 104 by heat storage, during the generate mode 110 when the pump 112 is unable to circulate coolant through the coolant circuit 106. Examples of suitable ethoxy-nonafluorobutanes include Novec™ 7200 Engineered Fluids, available from the 3M Corporation of Maplewood, Minn.

The power converter 104 is electrically connected to the starter/generator 102 by the starter/generator lead 118, is electrically connected to the power bus 16 (shown in FIG. 1) by the power bus lead 120 and includes a housing 132. The power converter 104 also includes a cold plate 134 and an active rectifier 136 with one or more inductor 138, diode device 140, and a plurality of solid-state switch devices 142. In certain examples the solid-state switch devices 142 include MOSFET solid-state switch devices. In accordance with certain devices the solid-state switch devices 142 include IGBT solid-state switch devices.

The cold plate 134 is arranged within an interior 144 of the housing 132, defines a coolant channel 146 therethrough, and has a cold plate inlet 148 and a cold plate outlet 150. The cold plate inlet 148 extends through the housing 132 and fluidly couples the intermediate conduit 128 to the coolant channel 146 of the cold plate 134. The cold plate outlet 150 fluidly couples the coolant channel 146 of the cold plate 134 to the return conduit 130. It is contemplated that the cold plate 134 thermally couple the active rectifier 136, e.g., the one or more inductor 138, diode device 140, and/or the solid-state switch devices 142, to the coolant channel 146 for communication of heat to the coolant 116 disposed within the coolant channel 146, the cold plate bounding (and/or is connected in series with) the coolant circuit 106 within the power converter 104. In certain examples the coolant channel 146 extends vertically through the housing 132 relative to gravity. In accordance with certain examples the condenser 114 is arranged above the power converter 104 relative to gravity, e.g., when the vehicle 10 (shown in FIG. 1), is in straight and level flight. It is also contemplated that the condenser 114 can be inclined relative to gravity along the direction of the ambient air flow 42 (shown in FIG. 1) within the fan duct 40 (shown in FIG. 1), an inlet end 152 of the condenser 114 seating the return conduit 130 being above an outlet end 154 of the condenser 114 seating the supply conduit 126 relative to gravity.

The one or more inductor 138 is arranged within the interior 144 of the housing 132, is thermally coupled to the coolant channel 146 by the cold plate 134, and electrically connects the power bus lead 120 to the active rectifier 136. The active rectifier 136, and more specifically the plurality of solid-state switch devices 142, are operatively associated with the controller 122, and is thermally coupled to the coolant channel 146 by the cold plate 134. In certain examples the diode devices 140 are also arranged within the interior 144 of the housing 132, are thermally coupled to coolant channel 146 by the cold plate 134, and electrically connect the active rectifier 136 to the starter/generator lead 118.

The controller 122 is operably connected to the power converter 104 by the link 124, e.g., a wired or a wireless link, and includes a processor 158, a device interface 160, a user interface 162, and a memory 164. The device interface 160 connects the processor 158 to the link 156, and therethrough the power converter 104. The processor 158 is operably connected to the user interface 162 and is disposed in communication with the memory 164. The memory 164 has a plurality of program modules 166 recorded thereon containing instructions that, when read by the processor 158, cause the processor 158 execute certain operations. Among the operations are operations of a method 200 (shown in FIG. 5) of cooling a power converter, e.g., the power converter 104, as will be described. The controller 122 can be implemented using circuitry, software, or a combination of circuitry and software.

Figure 3:
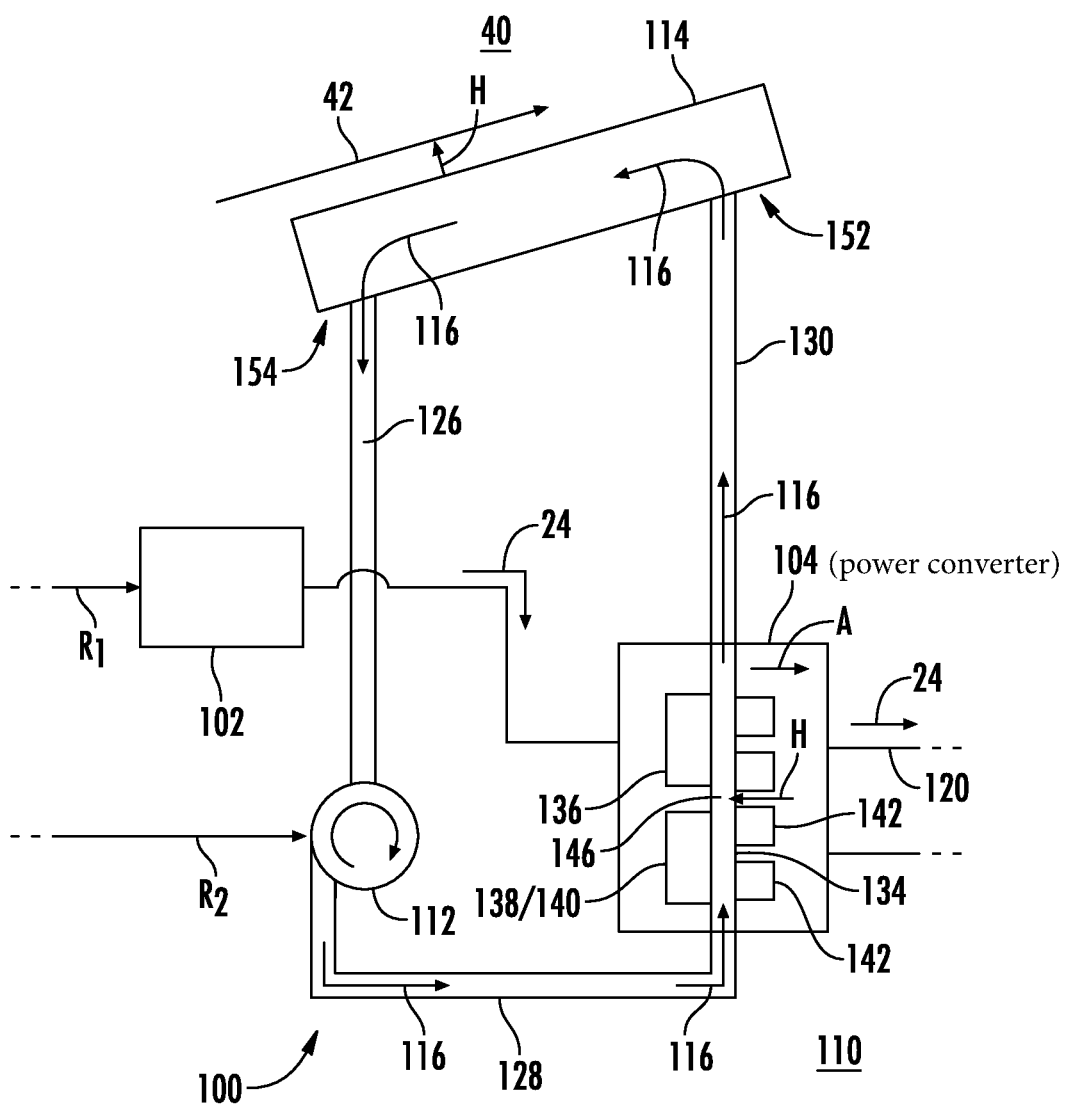
FIG. 3 is a schematic view of the starter/generator arrangement of FIG. 1, showing the power converter being cooled by the coolant circuit while a pump operatively connected to the coolant circuit is idle in the start mode.

With reference to FIG. 3, starter/generator arrangement 100 is shown with the starter/generator 102 in the generate mode 110. In the generate mode 110 the accessory gearbox 52 (shown in FIG. 1) communicates both starter/generator mechanical rotation $R_1$ to the starter/generator 102 and the pump mechanical rotation $R_2$ to the pump 112. The starter/generator 102 converts the starter/generator mechanical rotation $R_1$ into the generate mode electrical power 24, the power converter 104 communicates to the power bus 16 (shown in FIG. 1) in the first direction A. In the illustrated example the power converter 104 receives the generate mode electrical power 24 as variable frequency AC power and rectifies the variable frequency electrical power 24 into HVDC power suitable for communication to the power bus 16. Rectification can be accomplished, for example, using the one or more inductors 138, the diode-devices 140, and the solid-state state switch devices 142 of the active rectifier 136. Examples of suitable active rectifiers and rectification methods include those described in U.S. Pat. No. 9,473,040, issued on Oct. 18, 2016, the contents of which is incorporated herein by reference in its entirety.

As will be appreciated by those of skill in art in view of the present disclosure, the power converter 104 generates heat while communicating the generate electrical power mode in the first direction A, e.g., from cycling the solid-state switch devices 142 of the active rectifier 136 according to a pulse-width modulation algorithm provided by the controller 122. The cold plate 134 communicates the heat H into the coolant 116 disposed within the coolant channel 146. The pump 112 drives the coolant 116 once heated from the coolant channel 146 to the condenser 114 through the return conduit 130, wherein the heat H is sunk to the ambient air flow 42 traversing the fan duct 40. The coolant 116 one cooled is returned to the pump 112 via the supply conduit 126 for return to the power converter 104. In certain examples the cold plate 134 can be a flow-boiling cold plate, the heat H vaporizing a portion of the coolant 116 as the coolant 116 circulates through the coolant channel 146.

Figure 4:
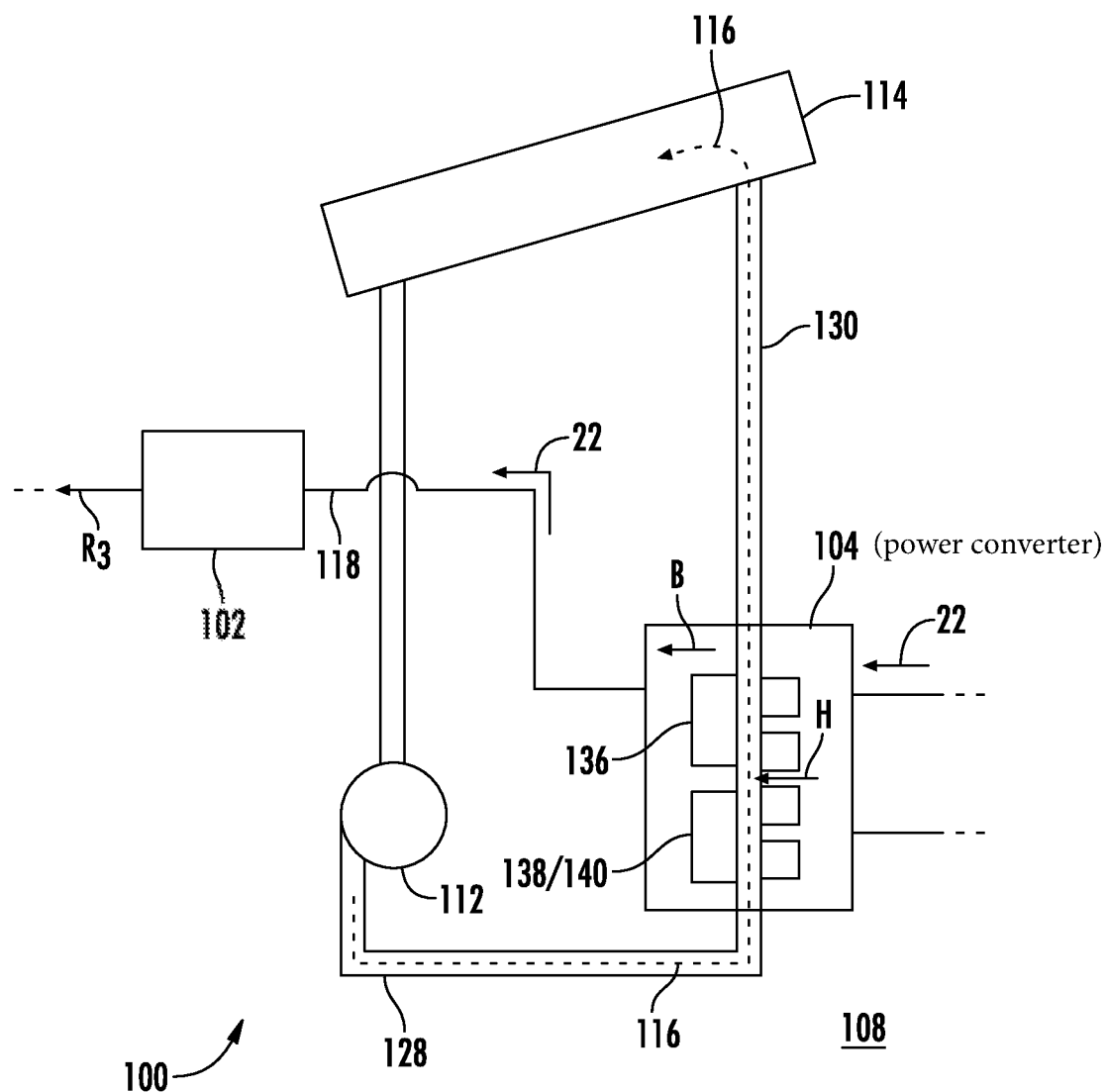
FIG. 4 is a schematic view of the starter/generator arrangement of FIG. 1, showing the power converter being cooled by coolant drive through the coolant circuit in the generate mode.

With reference to FIG. 4, the starter/generator arrangement 100 is shown with the starter/generator 102 in the start mode 108. In the start mode 108 the power converter 104 communicates the start mode electrical power 22 in the second direction B. Specifically, the power converter 104 receives the start mode electrical power 22 from the power bus 16 (shown in FIG. 1) and communicates the start mode electrical power 22 in the second direction B to the starter/generator 102 via the starter/generator lead 118. The starter/generator 102 in converts the start mode electrical power 22 into engine start rotation $R_3$, which the accessory gearbox 52 (shown in FIG. 1) communicates to the gas turbine engine 12 (shown in FIG. 1). Notably, the pump 112 is idle while the starter/generator 102 is in the start mode 108 and does not circulate the coolant 116 through the coolant circuit 106, the coolant 116 ion certain examples being substantially stagnant in this respect. In certain examples the power converter 104 inverts the start mode electrical power 22 (e.g., HVDC power) using the active rectifier 136 into variable frequency AC power to control rotational speed of the starter/generator 102.

As will also be appreciated by those of skill in art in view of the present disclosure, the power converter 104 also generates heat H while communicating the start mode electrical power 22 in the second direction B. It is contemplated that the heat H is communicated by the cold plate 134 into the coolant 116 inhabiting the coolant channel 146. The coolant 116 inhabiting the coolant channel 146 in turn stores the heat H during until such time as mechanical power is available to power the pump 112, which thereafter drives the coolant 116 once heated to the condenser 114 for circulation through the coolant circuit 106. In certain examples a portion of the coolant 116 once heated is siphoned from the intermediate conduit 128 to the coolant channel 146 to provide further coolant, siphoning occurring by heated coolant flowing upwards (relative to gravity) through the return conduit 130 due to density change associated with heating. In accordance with certain examples a portion of the coolant disposed within coolant channel 146 vaporizes, the vaporization accelerating (and strengthening) the aforementioned siphoning activity within the coolant circuit 106.

Figure 5:
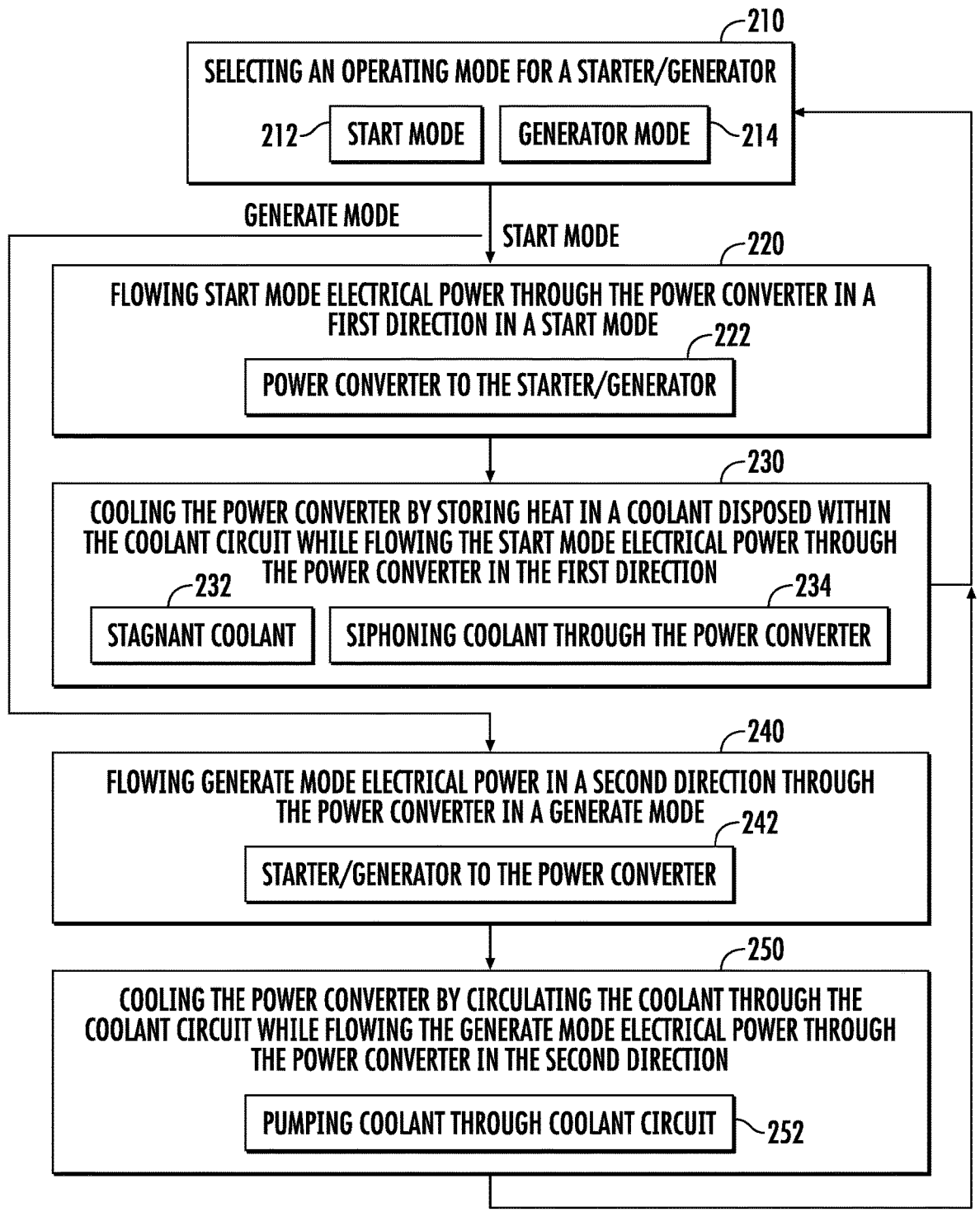
FIG. 5 is a block diagram of a method of cooling a power converter in a starter/generator arrangement, showing operations of the method according to an illustrative and non-limiting example of the method.

With reference to FIG. 5, the method 200 of cooling a power converter in a starter/generator arrangement, e.g., the power converter 104 (shown in FIG. 1), is shown. The method 200 includes selecting an operation mode for a starter/generator, e.g., the starter/generator 102 (shown in FIG. 1), as shown with box 210. In certain examples selecting the operating mode of the starter/generator can include selecting from a plurality of operating modes including a start mode, e.g., the start mode 108 (shown in FIG. 2), as shown with box 212. In accordance with certain examples selecting the operating mode can include selecting from a plurality of operating modes including a generate mode, e.g., the generate mode 110 (shown in FIG. 2), as shown with box 214. It is also contemplated that selecting the operating mode of the starter/generator can include selecting from a plurality of operating modes including both the start mode and the generate mode, as shown with box 212 and box 214.

As shown with box 220, the power converter flows the start mode electrical power in a first direction, e.g., the first direction A (shown in FIG. 4), when in the start mode. It is contemplated that the power converter flows the start mode electrical power therethrough in the first direction to a starter/generator, e.g., the starter/generator 102 (shown in FIG. 1), as shown with box 222. In certain examples flowing the start mode electrical power in the first direction includes rectifying the start mode electrical power using an active rectifier, e.g., the active rectifier 136 (shown in FIG. 2). In accordance with certain examples flowing the start mode electrical power to the starter/generator also includes inverting the rectified start mode electrical power into variable frequency AC power using the active rectifier.

As shown with box 230, heat generated by the power converter while converting the start mode electrical power from one form to another form is stored as heat within a coolant, e.g., the coolant 116 (shown in FIG. 2), cooling the power converter. It is contemplated that the power converter communicate heat to coolant disposed within, e.g., resident and/or inhabiting, a coolant channel of a cold plate disposed within the power converter, e.g., the coolant channel 146 (shown in FIG. 2) of the cold plate 134 (shown in FIG. 2), as also shown with box 230. In certain examples the coolant can be substantially stagnant, e.g., not forced through the power converter by a pump, as shown with box 232. In accordance with certain examples coolant can be siphoned through the power converter while in the start mode, as shown with box 234.

As shown with box 240, the power converter flows the generate mode electrical power in second direction, e.g., the generate mode electrical power 24 (shown in FIG. 3) flowed in the second direction B (shown in FIG. 3), when in the power converter is in the generate mode. It is contemplated that the generate mode electrical power flow from the starter/generator 102 to the power converter 104 and therethrough to a power bus, e.g., the power bus 16 (shown in FIG. 1), as shown with box 242. In accordance with certain examples flowing the generate mode electrical power to the power bus includes rectifying variable frequency AC power into HVDC power using the active rectifier.

As shown with box 250, heat generated by the power converter while converting the generate mode electrical power from one form to another form is communicated by the coolant to a condenser, e.g., the condenser 114 (shown in FIG. 1), cooling the power converter. It is contemplated that the power converter communicate heat to coolant circulating through the coolant channel of the cold plate disposed within the power converter, as also shown with box 250. In certain examples the coolant can pumped through a coolant circuit including the cold plate, as shown with box 252. In certain examples a portion of the coolant can be vaporized within the power converter as the coolant circulates through the cold plate, the cold plate being a flow-boiling cold plate in this respect, as also shown with box 252.

Bidirectional active rectifiers can be employed in power converters for starter/generator arrangements. When the starter/generator generates electrical power such bidirectional active rectifiers can converter three-phase AC power into HVDC power. When the starter/generator is employed to start the engine such bidirectional active rectifiers can provide power by converting HVDC power into AC power for powering the starter/generator. In both modes the bidirectional power converter generates heat, which must be removed from the bidirectional active rectifier.

In examples described herein power converters, e.g., power converters having bidirectional active rectifiers, are provided with coolant circuits. In certain examples the power converter includes a cold plate, e.g., a flow-boiling cold plate, that is contained within the power converter and arranged in series with the coolant circuit. When the starter/generator is in the generate mode a pump arranged along the coolant circuit circulates coolant, e.g., actively drives via pumping action, through the coolant circuit. When the starter/generator is in the start mode, and the pump is unable to circulate coolant, the coolant provides cooling to the power converter by storing heat within the coolant using the latent heat of the coolant. In certain examples the coolant circuit is arranged within a fan duct of the gas turbine engine to which the starter/generator is operatively associated. In accordance with certain examples the coolant includes ethoxy-nonafluorobutane. It is contemplated that the coolant circuit have a volume of coolant sufficient to store within the coolant occupying the cold plate and conduit the heat generated by the power converter during an engine start, e.g., about eight (8) kilowatts during a start cycle lasting about sixty (60) seconds.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A gas turbine engine, comprising:
a fan supported for rotation about a rotation axis;
a fan shroud extending about the fan and axially along the rotation axis, the fan shroud bounding a fan duct defined between the fan shroud and the rotation axis; and
a starter/generator arrangement that is arranged within the fan duct, comprising:
a starter/generator having a start mode and a generate mode;
a power converter electrically connected to the starter/generator, the power converter configured to flow start mode electrical power in a first direction from a power source to the starter/generator in the start mode, the power converter configured to flow generate mode electrical power in a second direction from the starter/generator to an electrical load in the generate mode; and
a coolant circuit having a pump and a condenser in fluid communication with the power converter, wherein the pump is fluidly coupled to the condenser through the power converter to cool the power converter by storing heat in a coolant disposed within the coolant circuit while flowing the start mode electrical power in the first direction through the power converter;
wherein the power converter comprises:
an active rectifier; a plurality of solid-state switch devices operatively associated with a controller via a pulse width modulation signal to convert power flowing through the power converter; a housing with an interior; a cold plate arranged within the interior of the housing and bounding the coolant circuit extending through the housing, wherein the plurality of solid-state switch devices are arranged within the interior of the housing, the plurality of solid-state switch devices connected to the cold plate and arranged on a side of the cold plate opposite the coolant circuit; and
a processor operatively connected to the power converter; a memory disposed in communication with the processor and having instructions recorded thereon that cause the processor to:
flow the start mode electrical power through the power converter in the first direction;
cool the power converter by vaporizing the coolant disposed within the power converter while flowing the start mode electrical power through the power converter in the first direction;
start a gas turbine operably connected to the starter/generator with the start mode electrical power; and
cool the power converter by vaporizing the coolant,
wherein the instructions cause the power converter to cease flowing the start mode electrical power through the power converter upon start of the gas turbine engine operatively associated with the starter/generator, and wherein;
a supply conduit fluidly couples an outlet end of the condenser and the pump; an intermediate conduit fluidly couples the pump to a cold plate inlet of coolant channel of the power converter; a return conduit fluidly couples a cold plate outlet of the coolant channel of the power converter to an inlet of the condenser; the condenser is above the power converter relative to gravity; the power converter is arranged above the intermediate conduit relative to gravity; the pump is arranged below the power converter relative to gravity; and the inlet end of the condenser is above the outlet end of the condenser relative to gravity, and
in the start mode:
the pump is idle and unable to circulate coolant; heat is transferred to the coolant via the coolant channel of the cold plates; a portion of the coolant once heated is siphoned from the intermediate conduit to the coolant channel to provide further coolant, siphoning occurring by heated coolant flowing upwards, relative to gravity, through the return conduit due to density change associated with heating, and the portion of the coolant disposed within the coolant channel vaporizes, the vaporization accelerating the siphoning activity within the coolant circuit.

2. The engine of claim 1, wherein the coolant includes ethoxy-nonafluorobutane.

3. The engine of claim 1, further comprising an accessory gearbox connected to the starter/generator and the pump.

4. The engine of claim 1, further comprising a starter/generator lead electrically connecting the power converter to the starter/generator.

5. The engine of claim 4, wherein the start mode electrical power flows from the power converter to the starter/generator through the starter/generator lead in the first direction.

6. The engine of claim 4, wherein the generate mode electrical power flows from the starter/generator to the power converter through the starter/generator lead in the second direction.

7. The engine of claim 4, wherein the starter/generator lead includes an A-phase lead, a B-phase lead, and a C-phase lead electrically connecting the power converter to the starter/generator.

8. The engine of claim 1, wherein the instructions further cause the processor to:
flow the generate mode electrical power through the power converter in the second direction; and
cool the power converter by circulating the coolant through the power converter while flowing the generate mode electrical power through the power converter in the second direction.

9. A method of cooling the power converter of the gas turbine engine of claim 1, comprising:
at the starter/generator having the start mode and the generate mode, the power converter electrically connected to the starter/generator, and the coolant circuit including the pump and the condenser in fluid communication with the power converter, the power converter fluidly coupling the pump to the condenser,
flowing start mode electrical power through the power converter in the first direction while in the start mode;
communicating the start mode electrical power to the starter/generator from the power source; and
cooling the power converter by storing heat in the coolant disposed within the coolant circuit while flowing the start mode electrical power through the power converter in the first direction.

10. The method of claim 9, further comprising:
flowing generate mode electrical power in the second direction through the power converter in the generate mode;
communicating the generate mode electrical power from the starter/generator to the electrical load; and
cooling the power converter by circulating the coolant through the coolant circuit while flowing the generate mode electrical power through the power converter in the second direction.

* * * * *